(12) United States Patent
Hill et al.

(10) Patent No.: US 8,101,928 B2
(45) Date of Patent: *Jan. 24, 2012

(54) DEFLECTION SIGNAL COMPENSATION FOR CHARGED PARTICLE BEAM

(75) Inventors: Raymond Hill, Rowley, MA (US); Steve Ake Rosenberg, Hillsboro, OR (US); Daniel B. Downer, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 287 days.

This patent is subject to a terminal disclaimer.

(21) Appl. No.: 12/533,939

(22) Filed: Jul. 31, 2009

(65) Prior Publication Data

US 2009/0289196 A1 Nov. 26, 2009

Related U.S. Application Data

(63) Continuation of application No. 11/433,048, filed on May 12, 2006, now Pat. No. 7,569,841.

(60) Provisional application No. 60/680,660, filed on May 14, 2005.

(51) Int. Cl.
*A61N 5/00* (2006.01)
*G21G 5/00* (2006.01)

(52) U.S. Cl. ............ 250/492.22; 250/492.2; 250/492.3; 250/397; 250/398

(58) Field of Classification Search ............... 250/492.2
See application file for complete search history.

(56) References Cited

U.S. PATENT DOCUMENTS

| | | | |
|---|---|---|---|
| 5,180,918 A | 1/1993 | Isobe | |
| 5,225,684 A | 7/1993 | Taki et al. | |
| 5,770,863 A | 6/1998 | Nakasuji | |
| 5,916,424 A | 6/1999 | Libby et al. | |
| 6,354,438 B1 | 3/2002 | Lee et al. | |
| 6,649,919 B2 | 11/2003 | Chao et al. | |
| 6,774,379 B2 | 8/2004 | Hashimoto | |
| 7,569,841 B2 * | 8/2009 | Hill et al. | 250/492.22 |

FOREIGN PATENT DOCUMENTS

JP 11238671 8/1999

* cited by examiner

*Primary Examiner* — David A Vanore
(74) *Attorney, Agent, or Firm* — Scheinberg & Griner, LLP; Michael O. Scheinberg; David Griner

(57) ABSTRACT

Charged particles that are in transit through a deflection system when the beam is repositioned do not received the correct deflection force and are misdirected. By independently applying signals to the multiple stages of a deflection system, the number of misdirected particles during a pixel change is reduced.

8 Claims, 6 Drawing Sheets

DEFLECTION SIGNAL COMPENSATION FOR CHARGED PARTICLE BEAM

This application is a continuation of U.S. patent application Ser. No. 11/433,048, filed May 12, 2006, which claims priority from U.S. Prov. Pat. App. 60/680,660 filed May 14, 2005, both of which are hereby incorporated by reference.

TECHNICAL FIELD OF THE INVENTION

The present invention relates to charged particle beam systems, such as focused ion beam systems and electron beam systems.

BACKGROUND OF THE INVENTION

Charged particle beams, such as focused ion beam systems and electron beam systems, direct charged particles onto a work piece for processing the work piece or for forming an image of the work piece. Charged particle beam systems are used, for example, in integrated circuit fabrication and other nanotechnology processing. Charged particles beam systems typically include a source of particles, a beam blanker, accelerating lenses, focusing optics, and deflection optics.

A charged particle source may be, for example, a liquid metal ion source, a plasma ion source, or a thermal field electron emitter, such as a Schottky emitter. A beam blanker interrupts the beam by directing it away from the work piece and into a solid stopping material.

The focusing optics focus the beam into a spot or a predefined shape on the surface of a sample. Focusing optics typically include a combination of condenser lenses and an objective lens. The lens can be electrostatic, magnetic, or various combinations of the two. Charged particle lenses, like light lenses, have aberrations that prevent the particles from being focused to a shape image. The aberration is least for charged particles passing through the center of the lens, and the aberration increases as the distance from the center of the lens increases. It is desirable, therefore, for the charged particle beam to pass very near the center of the lens. One type of aberration, referred to as "beam interaction" occurs because the particles in the beam, all having the same electrical charge, repel each other. The closer the particles are to each other, the greater the repulsive force. Because the particles are typically converging after passing through the objective lens, it is desirable to position the objective lens as close as possible to the work piece, to reduce the time that the particles are focused in a tight beam. The distance between the objective lens and the work piece is referred to as the "working distance."

The deflection optics direct the beam to points, referred to as "dwell points" or "pixels," on the surface of the work piece. For example, the beam may be directed in a raster pattern, in a serpentine pattern, or toward an arbitrary sequence of individual points. The beam will typically dwell at a point for a specified period, referred to as "dwell period," to deliver a specified "dose" of charged particles, and then be deflected to the next dwell point. The duration of the dwell period is referred to as the "dwell time" or the "pixel rate." (While pixel "rate" more properly refers to the number of pixels scanned per second, the term is also used to indicate the time the beam remains at each pixel.)

The deflection optics can be magnetic or electrostatic. In focused ion beam systems, the deflection optics are typically electrostatic. Electrostatic deflectors for focused ion beam are typically octupoles, that is, each deflector includes eight plates, distributed around the circumference of a circle. Different voltages are applied to the eight plates to deflect the beam away from the optical axis in different directions.

If the deflector is placed below the objective lens, the beam can pass through the center of the objective lens to minimize aberration. Such a configuration is used, for example, in the VisION System sold by FEI Company, the assignee of the present invention. Placing the deflector below the objective lens, however, increases the working distance, thereby increasing the beam aberration.

To minimize the working distance, one can place the deflector above the objective lens. With the deflector above the lens, however, when the beam is deflected, it is moved away from the center of the lens, thereby increasing certain aberrations. To solve this problem, many focused ion beam systems use a two stage deflector 100 as shown in FIG. 1 to deflect a beam 102 from an optical axis 104. A first stage 110 deflects the beam 102 to one side of optical axis 104, and the second deflector 114 deflects the beam back to the other side of optical axis 104 so that the beam 102 passes through the center of an objective lens 120, but at an angle such that the beam is deflected to be in the correct position as it impacts a work piece 122. Voltages of the same magnitude are typically applied to both stages of the deflector to achieve the desired deflection.

Charged particle beams process or image work pieces by delivering a calculated number of particles to precise locations on the work piece. Each particle causes a change in the work piece and the ejection of secondary particles. To precisely control the processing, one must control the number of particles impacting each point on the surface. As features of the work pieces processed by charged particle beams get ever smaller, charged particle beams must be able to more precisely deliver a controlled number of ions to each small point on the work piece surface. This precise control requires deflectors that can rapidly move a beam from pixel to pixel, while delivering the correct dose of particles to each pixel.

SUMMARY OF THE INVENTION

An object of the invention is to improve the ability of charged particle beam systems to precisely direct particles to a work piece.

As the demands for precision in charged particle beam processing increases, the time required for charged particles to move through the charged particle beam system becomes a significant factor in precisely controlling the beam. For example, when a signal applied to a deflector system is changed to direct the beam from a first dwell point to a second dwell point, charged particles that have already passed through part of the deflection system when the voltage is changed will not receive the correct forces to deflect them to either the first or the second dwell point. As dwell periods become shorter, voltage changes become more frequent, and the number of particles that are traversing the deflection system during voltages change increases, so more particles are misdirected, making it impossible to precisely process a work piece.

The invention compensates for the time required for the charged particles to traverse the system by altering one or more of the deflector signals. According to one embodiment of the invention, signals applied to the stages of a multiple stage deflector system are applied independently, for example, at different times, to more closely align the deflection signals with the flight of the particles through the deflection system so fewer particles are misdirected. For example, in a two stage deflection system, a change to the second stage deflector voltage may be delayed with respect to the change to the first stage deflector voltage. The delay provides improved beam control and allows for precise processing even at reduced dwell time.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
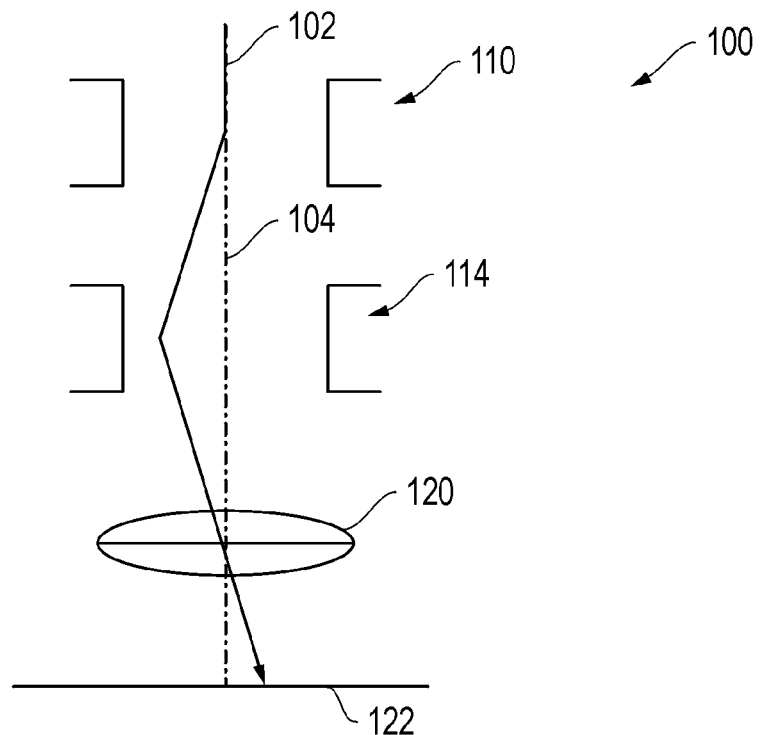
FIG. 1 shows a typical two stage deflector for a focused ion beam system.

The invention facilitates precise delivery of charged particles in a charged particle beam system having a directable beam, and is particularly useful when the system is changing the beam position rapidly, that is, when using short dwell times.

In a typical high performance charged particle beam optical column, a dual stage deflection system is used to control the position of the particle beam on the work piece. Each stage of the deflection system imparts an appropriate deflection to the beam as it passes. The two stages work together to ensure the beam follows the correct path through the column and the particles impact the work piece at the desired point. The amount of deflection in each stage is determined by electrical signals that apply voltages to the deflector plates in that stage. By varying the voltages on the plates, the electrical fields through which the charged particles pass are varied, which changes the force on the particles and therefore their landing positions on the work piece.

In a prior art deflection system, the beam is moved to a different pixel by changing the voltages on both deflection stages at the same time. However, because it takes the particles a finite amount of time to pass through the deflection system, there will be particles within the system while the voltage change is occurring. Those particles will receive part of the deflection force appropriate for one pixel and part of the deflection appropriate for the next pixel. Because of the crisscross design of the two stage deflector, the particles passing through the deflection system during the transition will typically impact not at a point between the two pixels, but at some other point.

For example, particles that have already passed through the first deflector stage when the voltages are changed will not be affected by the changed first deflector stage voltage. Rather, they are affected only by the second stage voltage change. These particles will land on the workpiece at an undetermined point that is neither the original point nor the final point. Some points on the work piece will not receive the full particle dose intended, while other points may receive an excess of particles. The effects of this phenomenon become more pronounced as the dwell time becomes closer to the time it takes a particle to pass through the deflection system, because as the dwell time gets shorter, a higher percentage of the charged particles are affected by the transition. When the dwell period is less than the time required for the particles to traverse the deflection system, none of the charged particles will receive the intended deflection force.

In accordance with a preferred embodiment of the invention, this misdirection effect of charged particles in the system during the signal change is be mitigated by altering the deflector signals. The deflector signals in any deflector stage can be varied. For example, in a two stage deflector, the alteration can include introducing a delay in the electrical signal going to the second deflector stage. The signal is first changed for the first stage and then, at a later time, the signal is changed for the second stage. This time delay can be varied for different implementations, but the amount of delay is typically related to how long it takes the charged particle to travel through the different parts of the deflector system.

To determine the effect of the time of flight and different signal delays on the particle landing position for systems, a focused ion beam system was modeled and various simulations were performed.

In one embodiment of an ion beam system, applicants delayed the second stage signal for each dwell point by the time of flight ("TOF") between the center of each deflector octupole. For example, if the distance between octupole centers is 100 mm and the speed of the ions is 0.25 mm/ns the signal to the lower octupole is delayed 400 ns from the time the signal is applied to the upper octupole. The optimum signal delay depends on the TOF, which depends on the velocity of the particles and therefore on the accelerating voltage, which corresponds to the beam energy. The signal delay is preferably programmable so that it can be adjusted as the beam energy is changed.

There is also some transition time required for the system electronics to change the voltage on the plates of the octupoles, and the beam moves in a non-linear fashion during the system electronics transition time. In preferred embodiments, the transition is made as short as possible. The simulations described below show the short time period of non-linear behavior, although the behavior is actually not as bad in a real system.

Simulation Model

Figure 2:
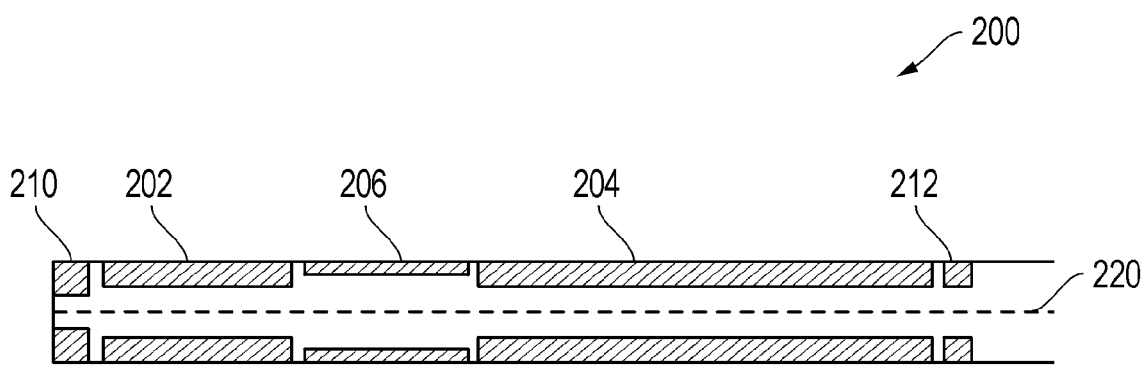
FIG. 2 shows a two stage deflector used to model the effect on deflection of the time of flight of the ions through the deflector.

A simplified two dimensional, planar model of a deflection system for an ion beam system was created using the charged particle simulation software Simion 7.0 (Ion Source Software) from Scientific Instrument Services, Inc., Ringoes, N.J. FIG. 2 shows a deflection system 200 that was modeled. Deflection system 200 includes an upper octupole 202 and a lower octupole 204, separated by a spacer 206. FIG. 2 also shows an upper octupole termination plate 210 and a first element 212 of a second ion lens. The first element of the second ion lens 212 serves as a field termination element for the lower octupole 204 to provide a more realistic axial deflection field. (The first ion lens is position above the deflection system 200 and is not shown or modeled). All components are centered on an optical axis 220.

Figure 3:
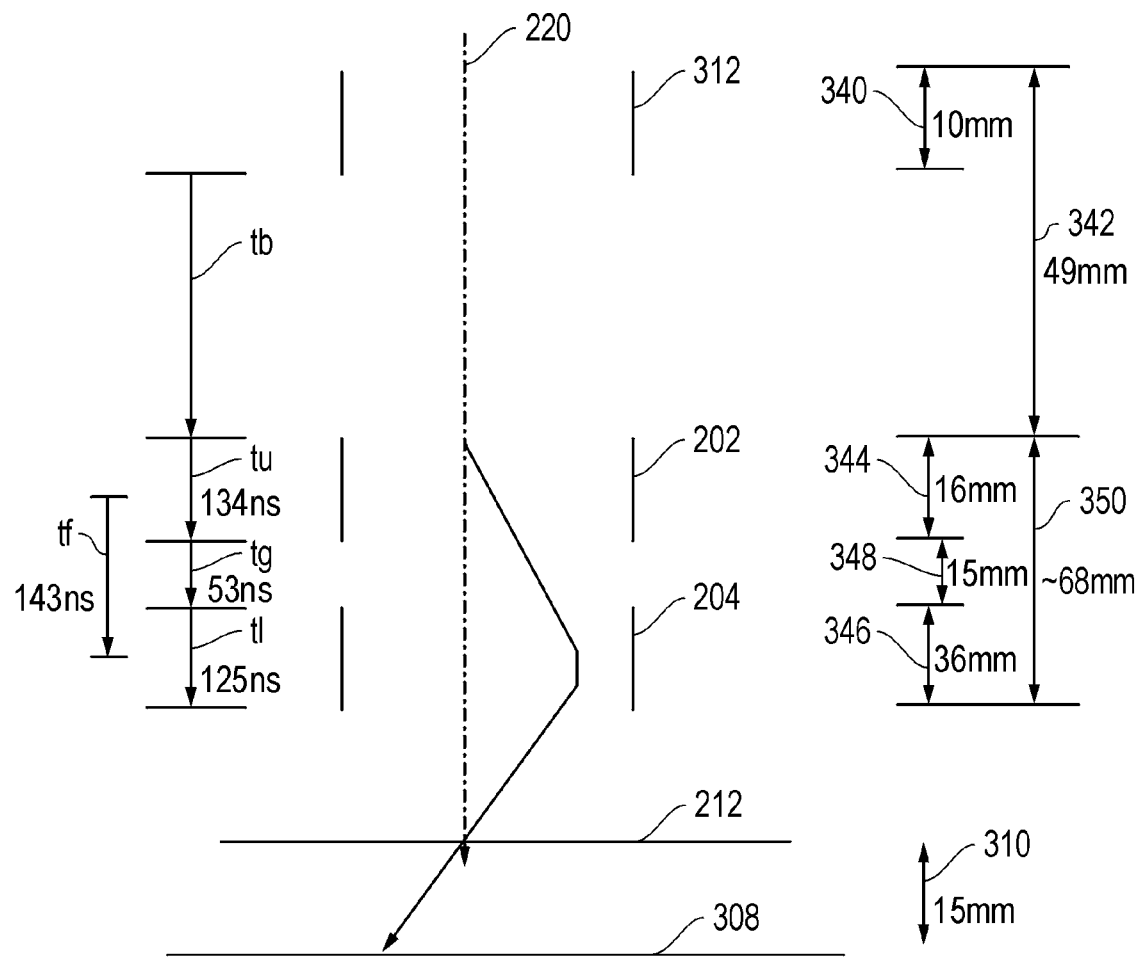
FIG. 3 shows distances and time delays in a typical focused ion beam column from the blanking plates to the work piece.

FIG. 3 shows a schematic of the ion beam column that was modeled in FIG. 2. Blanking plates 312 are positioned above upper octupole 202. A termination plane 308 is added at a typical working distance 310 of 15 mm below lens 212. This lens configuration allows the comparison of deflected ion positions as a function of time Simulated groups of 400 to 1000 ions were launched on an optical axis 220, each ion separated by a 1 ns delay. This provides a stream of ions similar to a continuous beam. Ions launched at different times are in different parts of the column when the deflection voltages changes. A user program was written in Simion's programming language to modulate the voltages on the octupole plates in real time as the ions are in flight through the model. Simion's recording features were used to record the ion's time and radial position at the 'sample plane', as well as more detailed information on the nanosecond-by-nanosecond position and local electrostatic fields of each ion in the model. This data was then imported into Mathematica 4.1, from Wolfram Research, Champaign, Ill., using a notebook designed to import, parse, and plot the data for a more automated analysis.

The model simulated 30 keV gallium ions, which traveled at about 0.29 mm/ns. The scale to the right in FIG. 3 shows the column dimensions, and the scale to the left shows the corresponding times for the gallium ion to travel those dimension. FIG. 3 shows that blanking plates 312 have a length 340 of about 10 mm. The distance 342 from the top of blanking plate 312 to the top of upper octupole 202 is 49 mm. The length 344 of upper octupole 202 is 16 mm and the length 346 of lower octupole 204 is 36 mm. The spacing 348 between upper octupole 202 and lower octupole 202 is 15 mm. The distance 350 from the top of upper octupole 202 to the bottom of lower octupole 346 is about 68 mm.

For a 30 keV gallium ion beam, the time, tb, required for an ion to travel from the bottom of the blanking plates to the upper octupole is 134 ns. The time, tu, required for a gallium ion to travel through the upper octupole is 56 ns. The time, tg, required for a gallium ion to traverse the distance between the octupoles is 53 ns, and the time, tl, required for an ion to traverse the lower octupole is 125 ns. The time, tf, for an ion to go from the center of the upper octupole to the center of the lower octupole is about 143 ns. The total time for an ion to traverse the deflector assembly is tu+tg+tl, or about 234 ns. In addition to the time of flight delay, one must also consider the system electronics transition time of about 10 ns to change the voltage on the deflectors, and so one can consider the total time required to redirect the beam and have ions land on the desired new spot to be about 245 ns.

The octupole dimensions and positions were set so that the beam passes through the center of lens 212, and lower octupole creates the maximum field of view, deflecting the beam, for example, an extra 500 µm to achieve a 1 mm field of view. If a lower energy beam is used, the TOF is increased. For example, a 5 kv beam increases the TOF by 2.45 and the delay between centers of the octupoles would be 318 ns.

Simulation Results

The simulation results are discussed in three sections below: deflection without delay, deflection with delay (including optimal delay setting and rapid deflection), and blanking. All simulation used Ga+ions with an atomic mass of 69.7AMU and a kinetic energy of 30 keV. Commonly used gallium liquid metal ion sources are a mixture of more than one isotope, and the deflections and the time of flight of the different isotopes will be slightly different. One could use a single isotope gallium source to remove this factor. Deflection voltages on the plates were stepped in 10 V increments with each transition requiring 10 ns to complete.

The simulation moved the ion beam between four pixels. The target deflections at four voltages were computed as shown in Table 1:

TABLE 1

| Plate Voltage on octupoles (V) | Net Deflection (mm) |
| --- | --- |
| +/−185 | 0.855 |
| +/−175 | 0.808 |
| +/−165 | 0.761 |
| +/−155 | 0.715 |

Voltages of the same magnitudes are applied to both stages of the deflection, and the polarity of the plates are reversed in the first and second stages. To position the ion beam at the first pixel, which is 0.855 mm from the optical axis 220, a voltage of +/−185 V is applied to the upper octupole and the lower octupole. To deflect the beam to the second pixel, 0.808 mm from the optical axis, +/−175 V is applied to the upper and lower octupoles. The upper octupole is oriented such that its deflection is in the negative y direction. The lower octupole is oriented the opposite manner such that its deflection is in the positive y direction.

As described earlier, the ions were "flown" as a single group, with each ion in the group has a 1 ns delay relative to the preceding ion. In the graphs of FIGS. 4-7, the x-axis represents the ion's delay time relative to the start time of the first ion.

Deflection Without Delay (Prior Art)

The simulation shows that operating the column in a deflection mode in which the voltages on the plates of the upper and lower octupole are changed simultaneously provides less precise beam positioning than operating with a delay between voltage changes on the octupole. An ion will arrive at the sample plane with the desired deflection only if it has experienced the full deflection fields in the upper and lower octupoles. Any ion that is inside the deflection system, from the beginning of the upper octupole to the end of the lower octupole, when the deflection voltage changes will be misdirected because it will be subjected to unmatched fields in the upper and lower octupoles.

Figure 10:
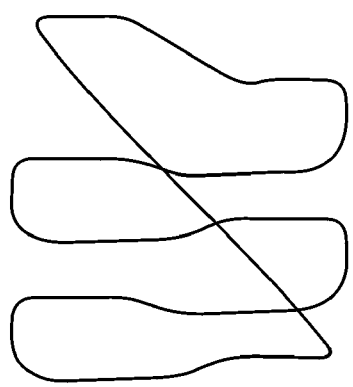
FIG. 10 shows the result of focused ion beam etching using a 100 ns pixel rate and no delay between the first stage and second stage deflector signals.

It takes about 245 ns for a 30 keV gallium ion beam to fully transition from one pixel to another, including 235 ns time of flight through the deflectors, as shown in FIG. 3, and 10 ns to change the deflector voltage. For a dwell time of 300 ns, for example, the ions see unmatched transitions voltages during 245 ns and receive the correct voltage during only 55 ns. Even if the system electronics delay were eliminated, the minimum time for a pixel-to-pixel transition on the sample plane is just under 245 ns.

Figure 4:
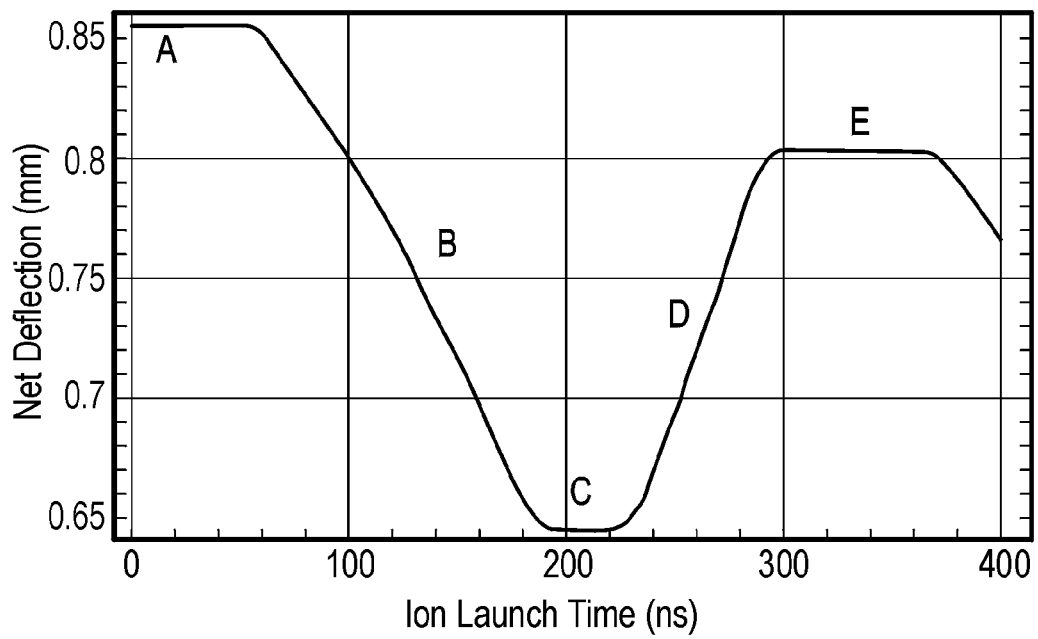
FIG. 4 shows the actual charged particle deflection determined by a simulation where the pixel rate is 300 ns and there is no delay in applying the deflection signals to the two stages.

FIG. 4 shows a plot of ions simulated in a no-delay deflection system having a pixel time of 300 ns and in which the signals are changed simultaneously in both deflection stages. The x-axis represents the time from the beginning of the simulator that an ion was launched and the y-axis shows the calculated deflection of the ion. The target deflection of the first set of ions, which see the full +/−185 V deflection voltages in both octupoles, is 0.855 mm as shown in Table 1. The target deflection of the second set of ions is 0.808 mm, with +/−175V applied to the octupoles. In the simulation, the ions begin with a deflection voltage of +/−185V applied to the octupoles, and then the deflection voltage is changed to +/−75V for 300 ns. The octupole voltage is changed periodically at the pixel rate. During most of the dwell period, the ions do not land at the first or the second target pixel location. The plot in FIG. 4 can be divided into five regions for analysis.

Region A. These ions, being the first launched traveled through the entire assembly before the voltages were changed. These ions are subject to the correct +/−185V through both octupoles and are deflected 0.855 mm as required.

Region B. The ions represented in this region of the plot were inside the lower octupole when the voltages were changed. Ions started later in the simulation, that is, those higher up in the lower octupole when the voltage changes, experienced a greater period of reduced deflection potential (175 V vs. 185 V) in the lower octupole.

Region C. Ions in this group were in the spacing or gap between the upper and lower octupoles when the voltages were changed. While these ions were subject to unbalanced deflection voltages, they all experienced the same deflection in the upper and in the lower octupoles.

Region D. These ions were in the upper octupole at the time of the voltage change. Those with later launch times were higher up in the octupole and therefore experienced the correct voltage for a longer time and are, therefore, deflected closer to the target deflection.

Region E. These ions were above the upper octupole at the time of the voltage change, and therefore were subjected to only the stable deflection voltages of +/−175 V in the upper and lower octupoles. These ions are properly deflected 0.808 mm from the optical axis.

In FIG. 4, the unstable deflection transition period begins with ions launched at about 55 ns from beginning of the simulation and ends with ion launched at about 300 ns. The total time required to reposition the beam from one pixel to the next, therefore, took about 300 ns−55 ns =245 ns, which is the total transit time of the deflection system. Thus, regardless of the speed of the deflection electronics, the fastest pixel-to-pixel transition at 30 keV in the ion column without a lower octupole signal delay is about 245 ns. More generally, the fastest pixel-to-pixel transition that can be achieved in any ion column employing a similar deflection subsystem and lacking a deflection delay is equal to the transition time of the ions through the deflection subsystem.

The actual pixel dwell time ($T_{actual}$), that is, the time during which the beam is delivering ions to the intended position on the work piece, is equal to the programmed, intended dwell time ($T_{programmed\ dwell\ time}$) minus the pixel transition time ($T_{pixel\ transition}$) of the deflection system.

$$T_{actual} = T_{programmed\ dwell\ time} - T_{pixel\ transition}$$

Therefore, if the ion column deflection system described above is driven at a pixel rate of 300 ns with 30 keV Ga+ions, the actual dwell time per pixel is 300 ns−245 ns=55 ns. This difference between the actual dwell time and the programmed dwell time is significant when attempting to calculate the dose per pixel of a scanning ion beam. Each pixel will received less ions than intended during its programmed pixel time, and may received an unknown number of misdirected ions when the beam is intended to be positioned elsewhere.

Deflection with Delay

By delaying application of the signal to the lower octupole until after the upper octupole signal has changed, the number of misdirected ions can be reduced. In some embodiments, rather than having to wait after a signal change for all ions in the deflection system to clear the deflector before subsequent ions are properly directed, only ions in about half the system need to exit before subsequent ions are properly directed.

There are many possible approaches to implementing a deflection delay in the ion column, and two examples are provided below. The preferred method for a specific implementation will depend on how the system user interface and beam scanning software are structured. The invention is not limited to any particular signal alteration, and skilled persons will be able to determine appropriate signals using the information provided herein as examples and guidance. Other aspects of the deflection system, such as the physical dimensions and positions of the components can be optimized for specific implementations.

In a first example based on the ion column model of FIG. 3, the voltages in the upper octupole begin to change at t=0 ns and finish changing at t=10 ns. The first ion subjected to the changed upper octupole deflection fields over its entire path through the upper octupole will arrive at the lower octupole at t=10 ns+56 ns+53 ns=119 ns, which represents the time required for the upper octupoles to finish modulating, the time required for an ion to travel through the upper octupole, and the time required for the ion to travel through the octupole gap. This duration is referred to as the "upper octupole transition time." 119 ns is an approximation because of field leakage into different parts of the 'field-free' regions.

In the first example, the delay for applying a pixel signal to the lower octupole is equal to the upper octupole transition time to allow the first ions of a new pixel to arrive at the lower octupole before changing its potentials. This allows some, but not all, of the last ions of the previous pixel to be properly deflected by the lower octupole before the voltage is changed. This embodiment, therefore, ensures that the new pixel starts on time, that is, the first ions directed to a new pixel are properly directed, and sacrifices the last ions of the preceding pixel. In the first example, the voltage to the lower octupole is changed about 119 ns after changing voltage on the upper octupole. After calculating a delay time, the delay is set to approximately the delay time, that is, within about +/−30 % of the calculated value, and the delay time can be optimized experimentally.

In a second example, the delay on the lower octupole is set to allow all the ions from the previous pixel to exit the lower octupole before modulating its voltages. While allowing the previous pixel to finish, the first ions of the next pixel are mis-deflected. Applying this example to the column model in FIG. 3, the time for ions to travel from the exit of the upper octupole to the exit of the lower octupole is 53 ns+125 ns=178 ns. The time is referred to as the "lower octupole delay time."

The net effect of the two examples is the same—a pixel transition time of about 130 ns as opposed to a transition time of 245 ns for the non-delay case. The difference between the embodiments described above is that the pixel transition occurs when the ions are at different positions within the deflection system, i.e., the transition occurs either at the end of one pixel or at the beginning of the next.

The calculated delay can be adjusted to optimize the number of misdirected ions. Applicants found that a delay of about 105 ns between the upper and lower octupole signals provided the fewest misdirected ions. In this model, the transition time was not considered part of the pixel rate, which caused the slight shift in the pixel deflection shown in FIG. 5.

Figure 5:
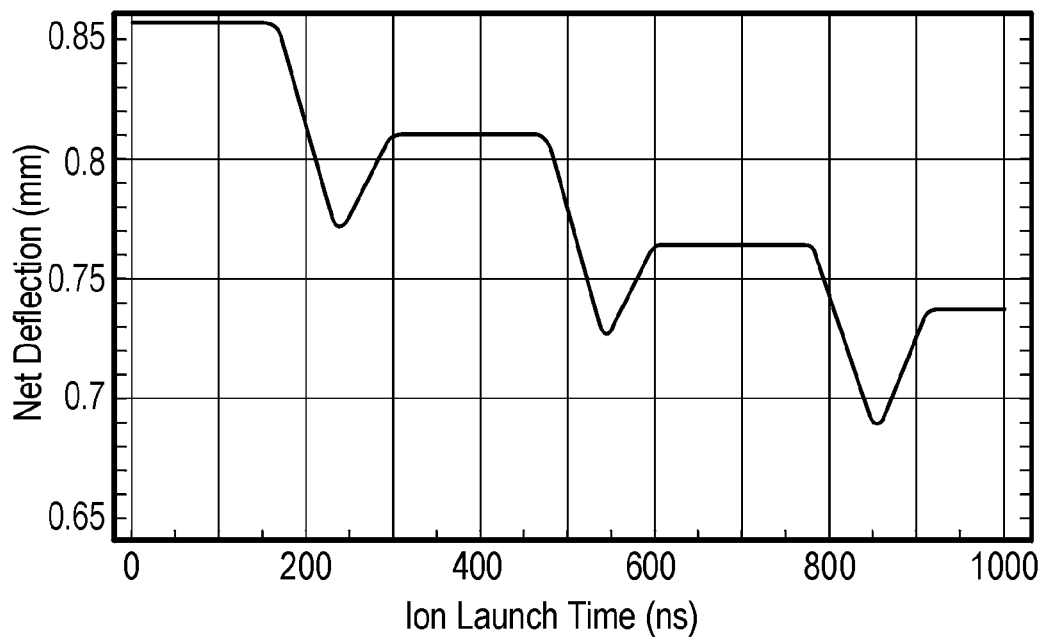
FIG. 5 shows the actual charged particle deflection determined by a simulation where the pixel rate is 300 ns and the second stage deflection signal is delayed 105 ns in accordance with an embodiment of the invention.

The downward trailing transition at each pixel in FIG. 5 and the subsequent upwardly movement toward the target deflection indicates that ions are not sufficiently deflected during part of the transition and then the ions are deflected further until the deflection is correct. The downward trailing region represents ions from the preceding pixel that were still in the lower octupole at the time of the transition, and the upwardly directed region represents ions that were in the partial transition of the upper octupole during its modulation.

In the example of in FIG. 5, with a delay of 105 ns in changing the voltage of the lower octupole and programmed pixel duration of 300 ns, about 130 ns are required for the pixel transition, leaving about 170 ns of actual pixel dwell time. The pixel transition time is present regardless of pixel rate. In deciding whether to implement a deflection delay for a specific application, both the pixel rate and the relative percentage of the pixel dose which is misdirected in the pixel transition are considered.

The simulation results have implications for operating the ion column with very fast deflection rates. Increasing pixel rates have the effect of reducing the width of the plateaus at each pixel. At a pixel rate equal to the pixel transition time, the current at each pixel is no more than the current during the transition as the beam never stops moving. The ion dose delivered to the pixel relative to the dose during transition decreases, which will decrease the signal-to-noise ratio of a charged particle beam image. Essentially, the image will become less clear as the number of secondary electrons emitted from the target pixel is decreased and secondary electrons emitted from other areas of the work piece increase. Thus, the brightness of a point on the image corresponds less well to properties of a point on the sample.

Figure 6:
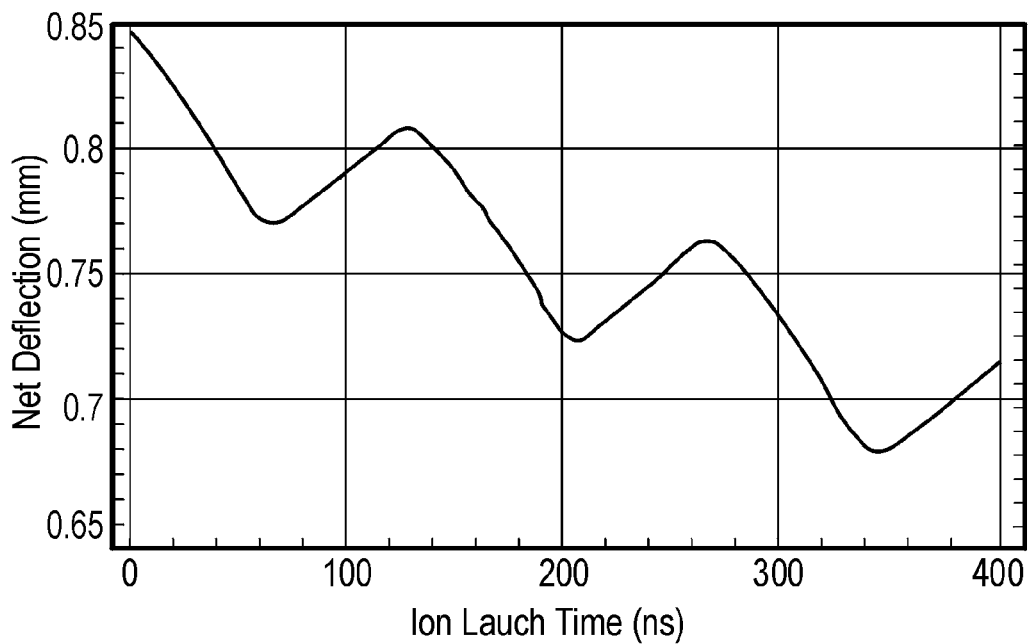
FIG. 6 shows the actual charged particle deflection determined by a simulation where the pixel rate is 130 ns and the second stage deflection signal is delayed 105 ns in accordance with an embodiment of the invention.
Figure 7:
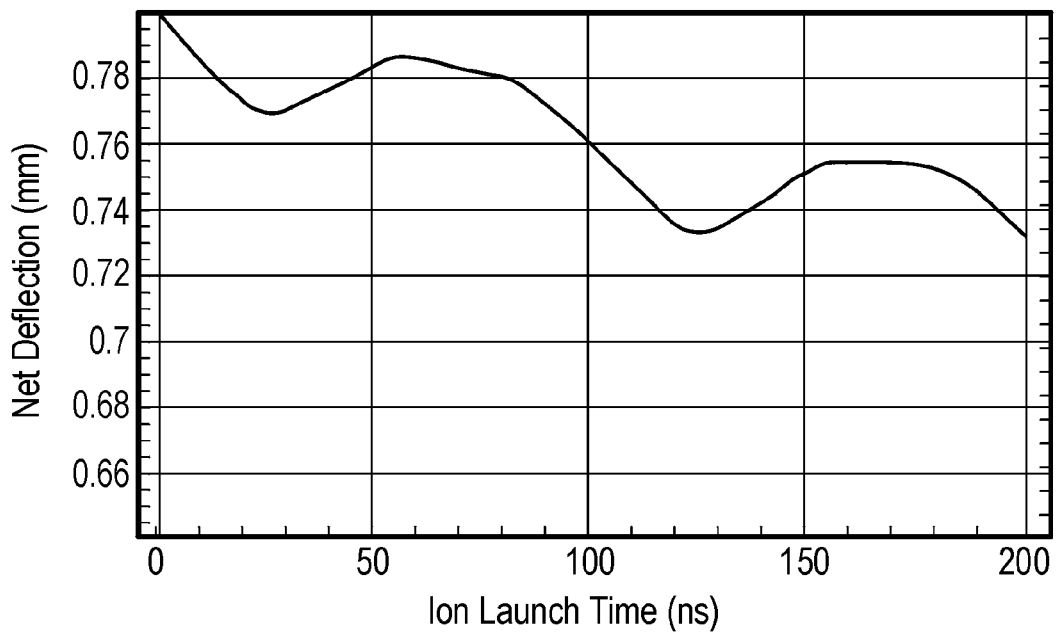
FIG. 7 shows the actual charged particle deflection determined by a simulation where the pixel rate is 90 ns and the second stage deflection signal is delayed 105 ns in accordance with an embodiment of the invention.

FIG. 6 shows the loss of pixel plateau. The plot in FIG. 6 corresponds to a pixel rate equal of 130 ns, which is also the pixel transition time using a 105 ns delay. As the pixel rate is increased beyond the pixel transition time, the ion deflection pattern becomes more complex, but still regular. This can be seen in FIG. 7, in which the deflection was operated at 90 ns pixel rate and a delay of 105 ns.

Blanker

The blanking plates 312 in the ion column of FIG. 3 are located about 39 millimeters above the top of the upper octupole. Practically, this means that there is a relatively long line of ions below the blanking plates which will be free to exit the column after the rest of the beam has been blanked. There will be an additional 134 ns of ion current in the column in addition to the 245 ns of current in the octupoles and the 148 ns of current in lens 212 between the octupole and the sample. That makes for a net 528 ns or so from the completion of the blanking modulation to the time that the beam terminates at the sample plane at 30 keV.

It is known to compensate for the blanking delay by adding the ions in the pipeline to the desired dose and dwell time, and by allowing extra time at the start of a scan to accommodate the blanking delay. A pre-blanking software routine can be used to compensate for the drift space and to ensure that the beam is blanked at the optimum time so that all dwell points receive close to the specified dose. The determination of the blanking compensation becomes somewhat complicated, however, when operating at a 100 ns dwell time, and the blanking delay is 500 ns.

Test Results

FIGS. 8-11 shows representations of samples that were subjected to focused ion beam processing using a VisIONary™ Ion Column from FEI Company. The beam was programmed to follow a serpentine pattern on the samples. For this ion column, applicants calculated that a delay of 285 ns was appropriate between changing the first stage deflector signal and changing the second stage deflector signal. As described above, the delay was determined to correspond to the time of flight between the mid points of the deflectors plus the electronics transition time.

Figure 8:
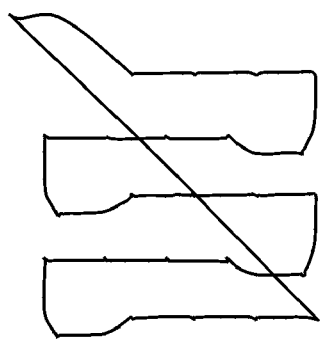
FIG. 8 shows the result of focused ion beam etching using a 200 ns pixel rate and no delay between the first stage and second stage deflector signals.
Figure 9:
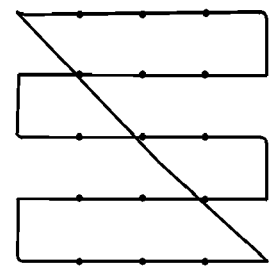
FIG. 9 shows the result of focused ion beam etching using a 200 ns pixel rate with a delay applied between the first stage and second stage deflector signals.

The patterns in FIGS. 8 and 9 were formed using a pixel rate of 200 ns. The structure in FIG. 8 was formed by the ion beam operating with no column delay, that is, the second stage deflector signal was changed at the same time as the first stage deflector signal. The pattern in FIG. 9 was formed with a delay of 275 ns, that is, the second stage deflector signal was changed 275 ns after the first stage deflector was changed. FIG. 8 shows that the beam deviated significantly from the programmed pattern. FIG. 9 shows that with the delay, the beam path much more closely approximates the desired serpentine path.

Figure 11:
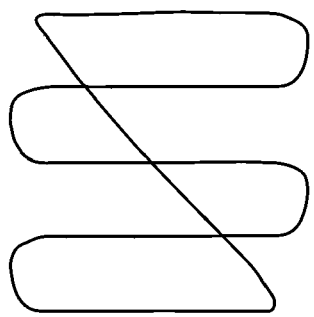
FIG. 11 shows the result of focused ion beam etching using a 100 ns pixel rate with a delay between the first stage and second stage deflector signals.

The structures shown in FIGS. 10 and 11 were formed with a pixel rate of 100 ns. The structure in FIG. 10 was formed by the ion beam operating with no column delay. The structure in FIG. 11 was formed with a delay of 275 ns. Because the pixel rate was much shorter than the transition time, which was about 550 ns, the effect of the transition time is greater.

FIG. 10 shows that the deviation of the beam from the squared-edged serpentine pattern is greater than the deviation in FIG. 8. FIG. 11 shows that applying the 275 ns delay greatly improves the beam pattern compared to FIG. 10, but because of the short pixel rate, even with a delay, the beam pattern deviates somewhat from the programmed squareedged serpentine pattern.

Figure 12:
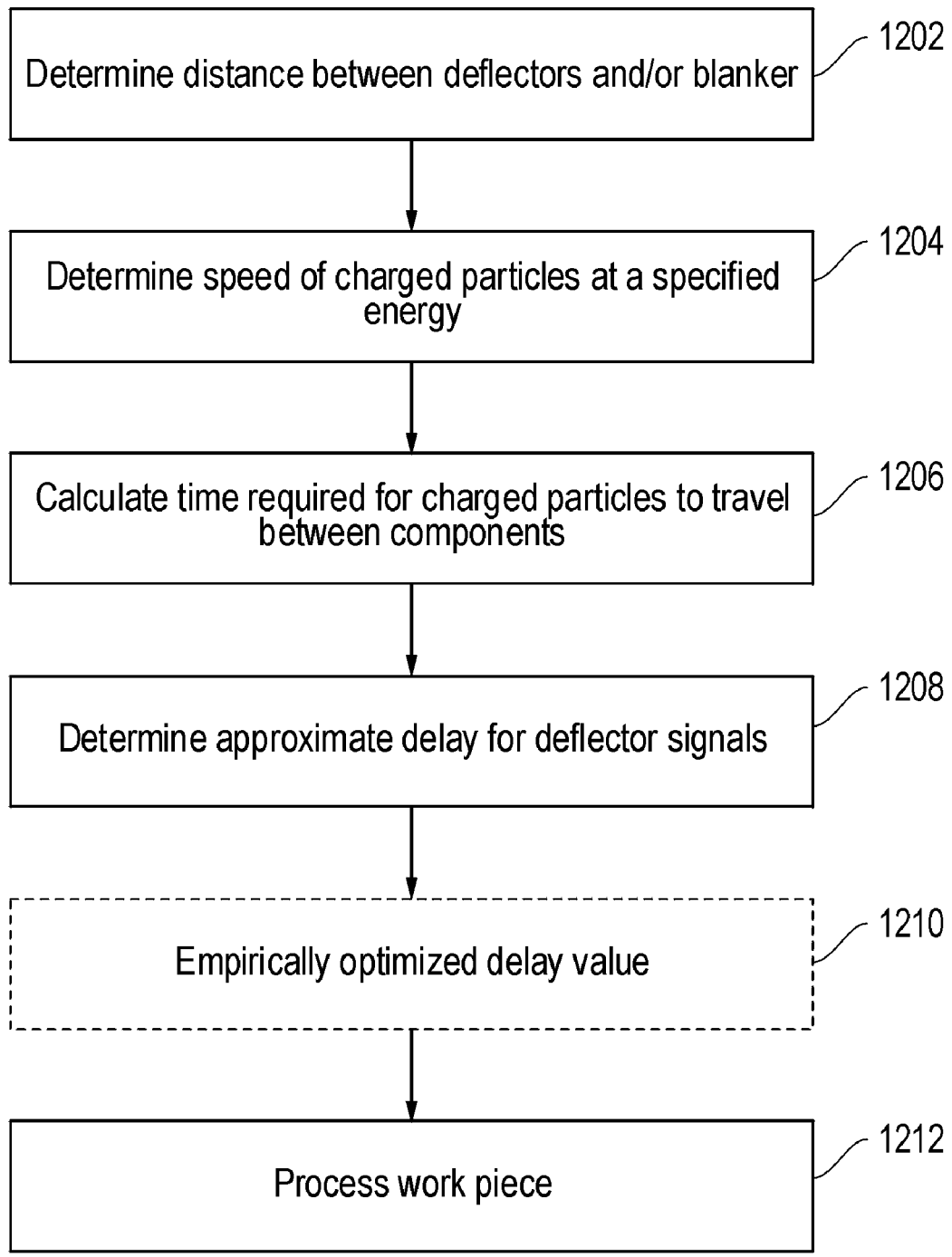
FIG. 12 shows a preferred method in accordance with the invention.

FIG. 12 shows a preferred procedure for implementing an embodiment of the invention. In step 1202, the distance between the column components, including the blanker and the deflectors, are determined. In step 1204, the speed of the particles in the column is determined. The speed will depend on the mass of the particles and the accelerating voltage, and the speed corresponds to the particle energy. Once the speed of the particles and the distances are determined, the time of flight can be determined in step 1206. From the time of flight, an approximate delay is determined in step 1208 using, for example, one of the methods described above. For example, the delay may be based on the sum of the electronic delay, and the TOF in the upper octupole and the gap between the octupoles. As another example, the delay may be based on the TOF in the gap and the lower octupole. In optional step 1210, the delay is optimized through testing. Once the delay is determined, the work piece is processed in step 1212. Skilled persons will recognize that the charged particles may undergo acceleration between the blanker and the deflector, and the time of flight is determined based upon the speed through the deflectors.

Operating the deflection system without a delay between the upper and lower octupoles will result in a 'pixel transition time' equal to the transit time of an ion through the entire deflection subsystem. This pixel transition time depends on the speed and type of the charged particles and on the length of the deflection system, so the pixel transition time is constant in a charged particle system for a given particle specie and energy. With the implementation of a deflection delay, that pixel transition time can be reduced to the transit time of an ion through roughly one-half of the deflection system.

Since the time of flight depends upon the mass of the charged particle and its energy, a preferred charged particle beam system used to practice the invention provides an adjustable signal delay, so that the signal delay can be varied depending upon the charged particle beam species and energy. For example, in a gallium focused ion beam system, one could use an ion source that contains a mixture of gallium isotopes, or, one could use a source composed primarily of a single gallium isotope. The beam energy used with a single ion source can be varied, with higher energies used for milling and lower energies for imaging. The invention can improve both the accuracy of micromachining and charged particle beam assisted deposition, as well as improving imaging.

There are a number of ways to implement such a deflection delay. The preferred implementation will depend on other factors in the column electronics and operating software.

The model and embodiments described above provide examples of the invention applied to a gallium focused ion beam system. The invention is applicable to any charged particle beam system. The invention is not limited to a two stage deflector. For example, the blanker delay can be compensated in a single stage deflector. The invention is useful with any components of a charged particle beam system in which the separation of components that control the beam in response to electronic signals affects the beam control because of the time of flight between the components.

The invention could also be useful in electron beam systems. Because electrons typically traverse through an electron beam system at speeds much higher than those of ions in a focused ion beam system, deflection based beam control problems are not limiting in current electron beam systems, but as specifications get tighter, particularly for low energy beams, the invention could be useful in electron beam systems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of directing charged particle beams in a charged particle beam system, comprising:
   applying a first deflection signal to a first stage deflector, the first deflection signal corresponding to a first dwell point; and
   applying a second signal to a second stage deflector, the second deflection signal corresponding to the first dwell point and being delayed with respect to the first deflection signal.

2. The method of claim 1 further comprising:
   altering the first deflection signal to correspond to a second dwell point; and
   altering the second deflection signal to correspond to the second dwell point, in which the altering of the second deflection signal is delayed with respect to the alteration of the first deflection signal, the delay being determined by the time of flight of a particle in the beam between different points in the charged particle beam system.

3. The method of claim 2 further comprising:
   applying a third signal to a third stage deflector, the third deflection signal corresponding to the first dwell point, and
   altering the third deflection signal to correspond to the second dwell point, in which the altering of the third deflection signal is delayed with respect to the alteration of the second deflection signal.

4. The method of claim 1 in which the delay is approximately equal to the transition time of the electronics plus the time required for a charged particle to pass from the beginning of the first deflection electrode to the beginning of the second deflector electrode.

5. The method of claim 1 in which the delay is determined so as to increase the actual dwell time at each pixel. a value between one half and three halves the pixel rate.

6. The method of claim 1 further comprising applying one or more additional deflection s to one or more additional deflectors.

7. The method of claim 1 in which the charged particle beam is a focused ion beam.

8. The method of claim 1 in which the charged particle beam is an electron beam.

* * * * *